United States Patent [19]

Cline

[11] 4,349,621

[45] Sep. 14, 1982

[54] PROCESS FOR X-RAY MICROLITHOGRAPHY USING THIN FILM EUTECTIC MASKS

[75] Inventor: Harvey E. Cline, Schenectady, N.Y.

[73] Assignee: General Electric Company, Schenectady, N.Y.

[21] Appl. No.: 253,985

[22] Filed: Apr. 13, 1981

[51] Int. Cl.³ .......................... G03C 5/04; B05D 3/06; G21K 1/00
[52] U.S. Cl. ........................................ 430/311; 430/5; 430/8; 430/320; 430/321; 430/325; 430/966; 430/967; 428/610; 378/35
[58] Field of Search .................. 430/311, 5, 325, 326, 430/8, 320, 321, 967, 966; 250/505, 514, 510; 428/610

[56] References Cited

U.S. PATENT DOCUMENTS

| | | | |
|---|---|---|---|
| 2,982,014 | 5/1961 | Meyer-Hartwig | 428/610 |
| 3,573,948 | 4/1971 | Tarnopol | 430/5 |
| 3,742,230 | 6/1973 | Spears et al. | 430/967 |
| 4,035,522 | 7/1977 | Hatzakis | 250/505 |
| 4,037,111 | 7/1977 | Coquin et al. | 430/5 |
| 4,260,670 | 4/1981 | Burns | 430/967 |

OTHER PUBLICATIONS

Albers et al., "Aligned Eutectics, Thin Film Growth", *J. of Crystal Growth*, vol. 18, pp. 147–150, 1973.
Arakawa et al., "Soft X-Ray Transmission Gratings", *SPIE*, vol. 240, 1980, pp. 52–55.
Tischer, P., "Advances in X-Ray Lithography", *Eurocon '80*, Stuttgart, Germany, 3/1980, pp. 46–51.
Brewer, G. R. (Editor), "Electron Beam Technology in Micro-electronic Fabrication"—Chapter 1 (pp. 1–58), Academic Press Inc., 1980.
Gudat, W., "Soft X-Ray Microscopy and Lithography with Synchrotron Radiation", Nuc. Ins. and Methods, 152, pp. 279–288, 1978.

*Primary Examiner*—Charles L. Bowers, Jr.
*Attorney, Agent, or Firm*—Stephen S. Strunck; James C. Davis, Jr.; Joseph T. Cohen

[57] ABSTRACT

A process for X-ray microlithography useful in the manufacture of microelectronic devices is provided. In the process, a mask in the form of a thin film of a eutectic is interposed between a source of X-rays and a substrate to selectively expose a layer of X-ray sensitive resist situate on the surface of the substrate. After exposure, the resist is developed to yield in the resist a replica of the submicron minimum feature size pattern of the mask.

17 Claims, 5 Drawing Figures

PROCESS FOR X-RAY MICROLITHOGRAPHY USING THIN FILM EUTECTIC MASKS

CROSS-REFERENCE TO RELATED APPLICATION

The invention herein is related to the invention disclosed and claimed in Ser. No. 245,764, filed Mar. 20, 1981, and assigned to the same assignee as the instant application; the entirety of said Ser. No. 245,764 application is herein incorporated by reference.

FIELD OF THE INVENTION

This invention relates broadly to the manufacture of microelectronic devices and more particularly to an X-ray microlithographic process for producing patterns having submicron minimum feature sizes in X-ray sensitive resists used in the manufacture of microelectronic devices.

BACKGROUND OF THE INVENTION

Microelectronics technology, and integrated circuit technology in particular, has experienced a period of extremely rapid growth during the past two decades. The mark of increased levels of performance, measured principally by lower power requirements and higher speed, has been decreased size of both the functional devices, or components, and the substrates, or chips, upon which the devices are located. Further sought-after improvements toward higher operating frequencies, lower power requirements, higher speed, and decreased cost will most likely be made through further decreases in device size and increases in the number of devices per area of the chip, i.e., increased functional density. Increased functional density will require improvements in manufacturing techniques, particularly those which selectively delimit or mask the areas or circuit elements of the device undergoing processing.

The technique common to the construction of most semiconductor devices to selectively delimit areas during processing is to create a pattern in a radiation sensitive material, i.e., a resist, located on the chip. The most common technique for creating the pattern is to interpose a mask containing the pattern between a source of radiation and the radiation sensitive material. Thereafter, the sensitive material is developed to selectively remove either the irradiated or nonirradiated material thus creating a secondary image of the pattern in the resist. After the subsequent device processing steps have been completed, the expendable resist layer is removed and then, if required, additional processing cycles of a similar nature may be conducted to fabricate additional levels or layers of the active devices.

Photographic reduction techniques are currently the mainstay of the industry for fabricating the masks and linewidths, i.e., minimum feature sizes, on the order of 2 to 5 microns are commercially prevalent. The most advanced masks, having minimum feature sizes as low as one micron, are produced by electron beam techniques and are used to fabricate the most complex and expensive integrated circuits available today.

The use of masks in the contact photolithography process is the method by which most commercial microelectronic devices are currently fabricated. Improvements in contact photolithographic technology have been principally responsible for the rapid growth of microelectronic technology over the past two decades. The contact photolithographic technique, however, is rapidly reaching practical and theoretical limits imposed by diffraction effects from the openings in the mask and reflection effects within the resist. To a certain extent the diffraction effects may be reduced, and the line widths decreased, by placing the mask in closer proximity to the light-sensitive resist. If the mask is placed in contact with the resist, irregularities on the resist surface may damage the surface of the mask thereby decreasing the service life of the mask and the quality of the patterns produced in the resist.

Some of the problems, principally the diffraction effects, of contact photolithography can be reduced by the use of projection photolithography and shorter wavelength radiation to expose the resist. The optics of the projection system limit the resolution of the projection photolithographic process thus this technique generally provides good resolution only over a limited area. To cover large areas, special techniques, such as step-and-repeat exposures, are required with a concomitant increase in processing time. An advantage of projection photolithography is that no contact is required between the mask and the photoresist thus decreasing the potential for damage to the mask thereby increasing device yield. Despite the many advantages of projection photolithography over contact photolithography, one micron feature size is probably the lower limit of the projection process in production.

Optical lithographic processes are limited in the depth of focus available due to diffraction effects. Moreover, measures used to minimize diffraction effects and produce narrower lines, such as shorter wavelength light and optical systems having small numerical apertures, result in decreases in the depth of focus. In turn, nonflatness of the chip, or wafer, further contributes to the limitation on the depth of focus and, therefore, the resolution. Pioneering techniques which are being developed to decrease the minimum feature size and increase resolution include X-ray lithography, electron beam lithography in the direct-write-on-the-wafer mode and the use of electron beams to fabricate masks for X-ray and photolithography. These later pioneering techniques have demonstrated capability of producing linewidths smaller than those currently obtained by or anticipated for photolithography. In addition to having several technical difficulties and limitations in common with photolithography, these pioneering techniques also have technical problems not experienced by photolithography. Details of these advanced processes, particularly the electron beam technology, may be found in the book, "Electron-Beam Technology in Microelectronic Fabrication", edited by G. R. Brewer (Academic Press, 1980).

In addition to the technical problems, these pioneering techniques are presently limited by extremely high capital equipment costs and rates at which devices or masks can be fabricated, i.e., throughput. Generally, as linewidth decreases, capital equipment costs increase and the time required to process a wafer or a mask increases. As in pointed out at page 49 of the above-cited book, captial equipment costs for electron beam equipment can range from 1.3 to 1.5 million dollars compared to 140 to 380 thousand dollars for photolithographic equipment. Exposure time and resolution are interrelated and impact on the number of wafers or masks that can be produced in a given time period. As shown in FIG. 1.18 of the cited book, the exposure time for a three inch diameter wafer by a 1X contact photolithographic process is about 8 minutes and typically provides 2 micron resolution. At 1 micron resolution, a commercial electron beam machine reportedly requires approximately 100 minutes to expose one three inch wafer or make a mask, i.e. it has a slow writing speed. Therefore, there is a demonstrated need for a cost-efficient high production microlithographic process which can produce high resolution submicron minimum feature size patterns over large areas of resist material used in the manufacture of microelectronic devices.

SUMMARY OF THE INVENTION

In accordance with the method of this invention, there is provided an X-ray microlithographic process using eutectic thin film masks, or reticles, in that portion of the process for the manufacture of microelectronic devices wherein the pattern of the mask is transferred to a resist material located on the device being processed.

Briefly described, the process involves the steps of providing a substrate for the manufacture of one or more microelectronic devices thereon, providing a source of X-radiation, interposing a mask having a pattern therein between the source and the body, exposing a thin layer of image recording material situate on at least a portion of said substrate to the X-radiation transferring thereby the pattern to the image recording material and developing the exposed image recording material thereby replicating the image of the pattern in the recording material. The mask is in the form of a thin film of a directionally soidified eutectic and the pattern is that of the eutectic, e.g., alternating lamellae substantially corresponding to the terminal solid solutions of the phases of a lamellar eutectic.

DETAILED DESCRIPTION OF THE INVENTION

In accordance with the method of this invention, there is provided an X-ray microlithographical process using eutectic thin films as masks in that portion of the process for the manufacture of microelectronic devices wherein the pattern of the mask is transferred to an image recording material located on the microelectronic device being processed. The manufacture of the eutectic thin films is disclosed and claimed in the above-referenced Ser. No. 245,764 application. As used herein and in the appended claims, the term microelectronic device includes semiconductors, integrated circuits, and optical and magnetic devices. Further, the term device is used to designate both a single functional electronic entity or the large scale unit which results when more than one type device, or a plurality of devices of the same type, are situated upon a single substrate.

Figure 1:
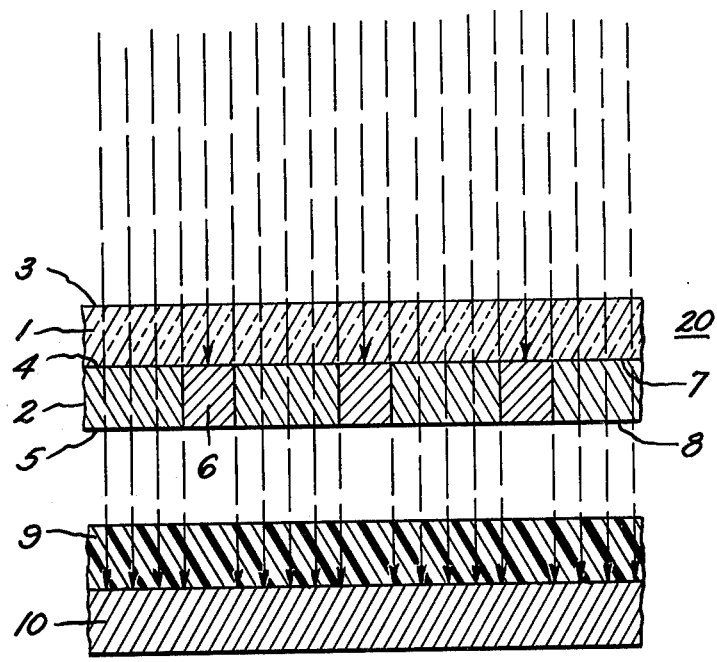
FIG. 1 is a schematic not-to-scale representation in cross-section of the X-ray microlithography process using a thin film eutectic mask.
Figure 1A:
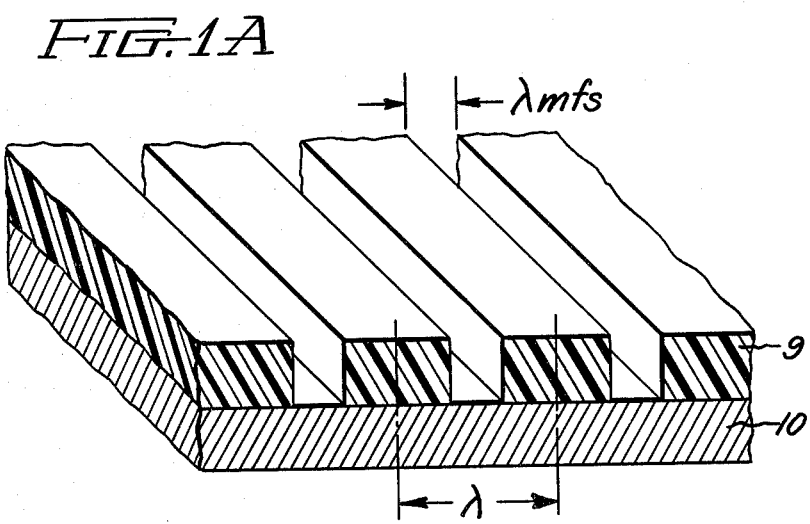
FIG. 1A is a sechmatic perspective representation of the exposed negative resist shown in cross-section in FIG. 2 following development and showing thereon the minimum feature size and the interlamellar spacing.

The use of a eutectic thin film as a mask in the fabrication of microelectronic devices is shown schematically, and illustratively for a lamellar lead-tin eutectic thin film, in FIGS. 1 and 1A. Mask 20 of FIG. 1 is comprised of mask substrate 1 and eutectic thin film 2 situate on at least a portion of one of the major planar substantially parallel surfaces, 3 or 4, of substrate 1. For the lamellar lead-tin eutectic thin film 2 of mask 20 of this example, the pattern is one of alternating lamella of the tin-rich 5 and lead-rich 6 phases. The lamella are oriented substantially perpendicular to and intersect substantially parallel top 7 and bottom 8 surfaces of thin film 2. The minimum feature size, $\lambda_{mfs}$, defined as the smallest feature of the pattern of the mask, in this case the width of the narrowest of the two lamellar phases shown, is shown on FIG. 1A. The interlamellar spacing, $\lambda$, defined as the distance from the center-line of one type lamella to the center-line of the next closest lamella of the same type, is also shown on FIG. 1A.

In FIG. 1, a collimated beam of X-rays passes uniformly through thin planar mask substrate 1 and preferentially through the lamellae of tin-rich phase 5 in comparison to the lamellae of lead-rich phase 6 to selectively expose resist 9 situate on semiconductor substrate 10. Mask substrate 1 is a material, such as mica, which has a low absorption coefficient for X-rays, compared to the absorption coefficients of the phases of the eutectic, and can also withstand the temperature of the directional solidification process used in the manufacture of the mask. Ideally, the substrate is transparent to the X-radiation used. After exposure, resist 9 is developed to yield the pattern shown schematically in FIG. 1A. Those skilled in the art of semiconductor device manufacture will understand that resist 9 of this example is of the negative type, however, the invention is not restricted by the type of X-ray sensitive resist utilized.

Using the method for making a eutectic thin film described in the above-referenced Ser. No. 245,764 application, a 0.56 micron thick layer of lead and a 1.44 micron thick layer of tin were sequentially deposited with an electron beam evaporator onto a 30 micron thick substrate of freshly cleaved mica. The film and substrate where placed in between two Pyrex ® microscope slides and directionally solidified at a rate of 0.0021 cm/sec using the modified line heater apparatus disclosed and claimed in the Ser. No. 245,764 application. The resulting mask, which measured about two inches square, was manufactured in about 50 minutes from the time the materials were placed in the evaporator.

Figure 2:
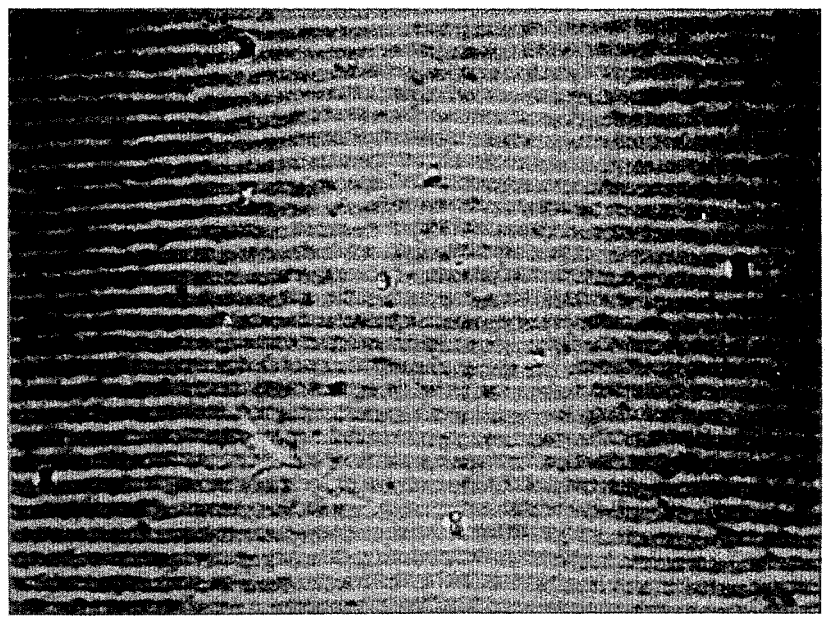
FIG. 2 is a 2000× photomicrograph of the top surface of a 2 micron thick lead-tin thin film eutectic mask having an interlamellar spacing of 1.81 microns and a minimum feature size (dark lead-rich phase) of 0.72 microns.

The interlamellar spacing of the resulting lead-tin eutectic thin film mask was observed to be 1.81 microns, the width of the minimum feature size lead-rich phase was 0.72 microns, and the width of the tin-rich phase was 1.09 microns, The lamellae, as observed looking down on the top major surface, were slightly curved due to poor thermal contact between the mica and the apparatus. A 2000× photomicrograph of a lead-tin eutectic thin film mask solidified under the same conditions described above, but situate on a Pyrex ® substrate, and having the same periodic spacing noted above is shown in FIG. 2. The absence of curvature of the lamellae in FIG. 2 is due to the better thermal contact provided by the Pyrex® compared to the mica. The artifacts which may be observed in FIG. 2 are principally dust particles.

Figure 3:
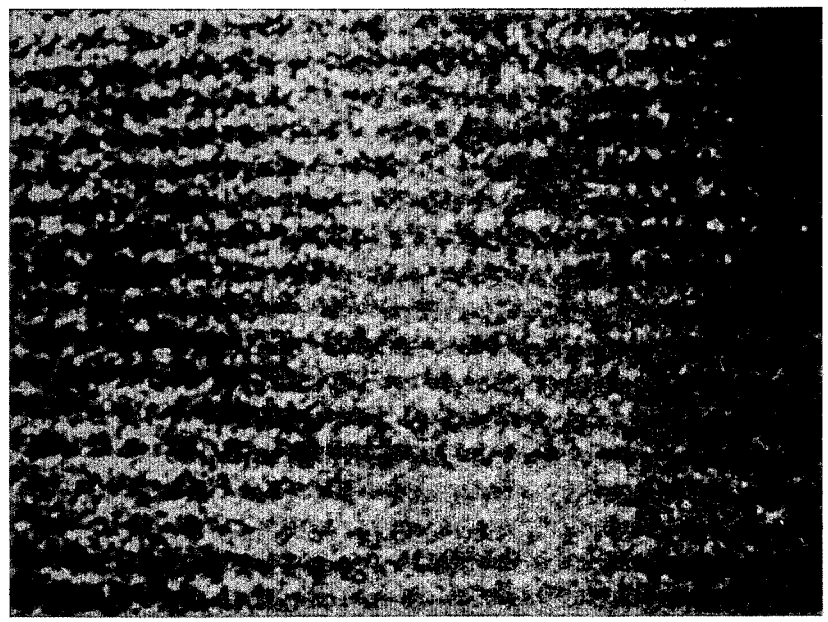
FIG. 3 is a 2800× microradiograph produced with the use of a lead-tin film eutectic mask of the type shown in FIG. 1.

The Pb-Sn thin film eutectic mask situate on the mica substrate, produced as described above, was then placed in contact with a high-resolution photographic plate and irradiated with X-rays to demonstrate use of the mask in a lithographic process. The plate, located 325 cm from the X-ray source, was exposed for 90 minutes using Cu $K_{60}$ from an X-ray tube operating at 20KV and 20ma to produce the microradiograph shown at 2800× in FIG. 3. The grain size of the emulsion on the plate was larger than the minimum feature size (lamella of the lead-rich phase) of the mask and thus limited the resolution available. To obtain high resolution X-ray microlithography with the eutectic thin film mask, an X-ray sensitive photoresist on a substrate would replace the photographic plate used above.

Microradiographs made with MoK$_{60}$ and Cr K$_{60}$ did not have as much contrast as those made with the Cu K$_{60}$ X-ray source because of the smaller X-ray absorption differential between the two phases for the Mo and Cr radiation. In X-ray lithography for microelectronic device manufacture, the hard X-rays used in making the microradiograph of FIG. 3 would preferably be replaced by soft X-rays, such as those generated by a synchrotron or an aluminum target in a conventional X-ray machine, to prevent photoelectrons generated in the substrate from exposing, i.e. fogging, the photoresist adjacent to the desired line or feature The contrast for the Pb-Sn eutectic mask would be a maximum at about 4Å, which corresponds to the Ag L$_{60}$ X-ray line, and at that wavelength the linear absorption coefficient of lead is 5.4 times that of tin. This latter point illustrates an additional advantage of the microlithographic process of this invention using eutectic thin films as masks, i.e., other eutectic systems may be used to improve the X-ray contrast at a given specific wavelength. Another means of contrast enhancement is to selectively etch away one or more of the phases present in the eutectic thin film. Additional information on X-ray lithography may be found, for example, in the paper, "Soft X-ray Microscopy and Lithography with Synchrotron Radiation", by Wolfgang Gudat (Nuclear Instruments and Methods, 152, pp. 279-288, 1978); the entirety of which is herein incorporated by reference.

Figure 4:
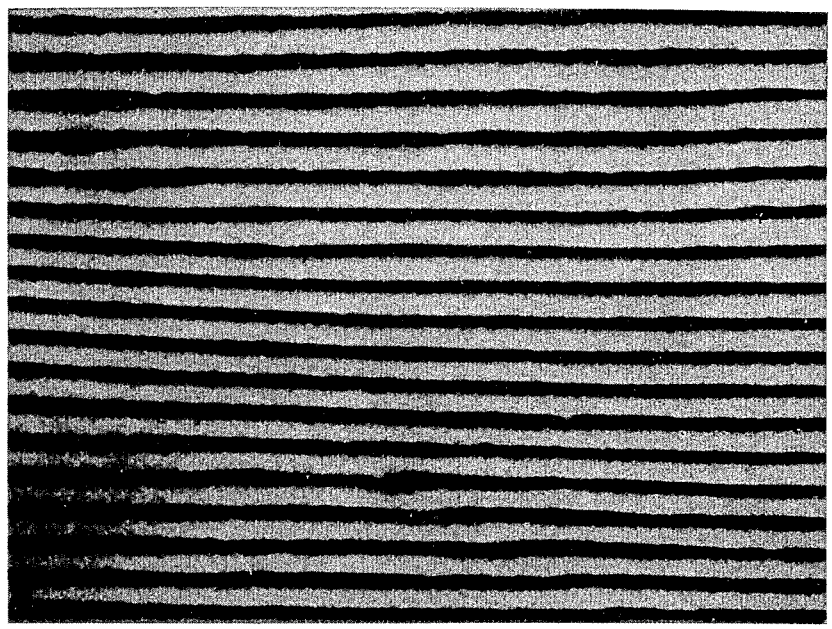
FIG. 4 is an 11,000× scanning electron micrograph of a 2 micron thick lead-cadmium thin film eutectic mask having an interlamellar spacing of 0.58 microns and a minimum feature size of 0.14 microns.

For microelectronic device manufacture, particularly mask registration, uniformity of the width and spacing of the mask features is essential at the submicron minimum feature size level. Some eutectic systems are naturally more capable of meeting the uniformity requirement. For example, the phases of the lamellar lead-cadmium eutectic have a fixed crystallographic relationship whereas the phases in the lead-tin eutectic do not. This crystallographic relationship imposes an additional constraint during solidification and enables the production of masks having the highly developed structure shown in the 11,000× scanning electron micrograph of FIG. 4. The flat surface of the film shown in FIG. 4 is tilted by approximately 20° from being perpendicular to the electron beam for contrast enhancement. In FIG. 4, the dark 0.14 micron wide lines are the leadrich phase and the interlamellar spacing is 0.58 microns.

Those skilled in the art of semiconductor device manufacture will recognize that the linear patterns of the eutectic thin film masks used in the novel process described herein may be formatted in a myriad of configurations to produce structures useful in the microelectronics arts. As noted in the above-referenced Ser. No. 245,764 application, additional degree of freedom are offered to the circuit designer by the ability to modify the interlamellar spacing of the eutectic thin film masks by controlling the slidification velocity. In contrast to electron beam mask-making processes, the rate at which eutectic thin film masks can be made increases as the minimum feature size decreases. The interlamellar spacing of the masks used in the novel process of this invention can be further fine tuned by growing "off-eutectic" composition eutectic thin films in those systems which are amenable to such forced growth techniques. It should be understood that variations in the use of the novel process set forth above may be made without departing from the scope of the invention as defined in the appended claims.

I claim:

1. A process for forming a pattern in a layer of X-radiation sensitive material situate on at least a portion of a microelectronic device undergoing processing comprising the steps of:
   (a) providing a mask, said mask having a pattern therein and being a composite of a substrate and a thin film of a eutectic, said substrate having top and bottom major opposed surfaces substantially parallel to each other and an outer peripheral edge area interconnecting said top and bottom surfaces, said thin film of a eutectic being situate on and contiguous with at least a portion of one of the major substrate surfaces and having upper and lower substantially parallel and generally planar major opposed surfaces, the perpendicular distance between said upper and lower surfaces being the thickness of said film, said eutectic having a pattern of a periodic geometric array of a first type lamella and at least a second type lamella located between lamella of said first type, said lamellae extending between and terminating in said upper and lower surfaces and being substantially perpendicular to the planes of said upper and lower surfaces, said lamellae having dissimilar X-ray absorption coefficients, the distance from the centerline of one lamella to the next closest lamella of the same type in said array being the interlamellar spacing, and the width of the narrowest of said types of lamellae being the minimum feature size;
   (b) interposing said mask between a source of X-radiation and said X-radiation sensitive material;
   (c) irradiating said mask with X-radiation, said X-radiation passing preferentially through the lamellae of said mask having the smallest X-radiation absorption coefficient thereby preferentially exposing said X-radiation sensitive material; and
   (d) developing said X-radiation sensitive material replicating thereby the pattern of said mask in said X-radiation sensitive material.

2. The process of claim 1 wherein the eutectic of said mask is the eutectic of lead and tin, said first type lamella is the tin-rich phase and said second type lamella is the lead-rich phase.

3. The process of claim 1 wherein the eutectic of said mask is the eutectic of lead and tin, said first type lamella is the tin-rich phase, said second type lamella is the lead-rich phase, the thickness of said film is about 2 microns, and the minimum feature size is about 0.72 microns.

4. The process of claim 1 wherein the eutectic of said mask is the eutectic of lead and cadmium, said first type lamella is the lead-rich phase, and said second type lamella is the cadmium-rich phase.

5. The process of claim 1 wherein said eutectic is the eutectic of lead and cadmium, said first type lamella is the lead-rich phase, said second type lamella is the cadmium-rich phase, the thickness of said film is about 2 microns, and the minimum feature size is about 0.14 microns.

6. The process of claim 1 wherein the material of said substrate is substantially transparent to X-radiation.

7. The process of claim 1 wherein the material of said substrate is mica.

8. The process of claim 1 further including the step of selectively removing by a chemical dissolution process at least one of the types of lamellae of said eutectic thin film of said mask prior to interposing said mask between said source of X-radiation and said X-radiation sensitive material.

9. In a process for X-ray microlithography which includes the steps of:
   (a) providing substrate, said substrate having top and bottom major surfaces and an edge area interconnecting said top and bottom surfaces, said body further having a thin planar layer of an X-ray sensitive image recording material situate on and contiguous with at least a portion of one of said surfaces;
   (b) positioning a source of X-radiation oppositely from said image recording material;
   (c) interposing a mask between said source and said image recording material, said mask having a pattern therein, said pattern having first type regions which are substantially transparent to X-radiation and at least second type regions which are substantially opaque to X-radiation;
   (d) irradiating said mask with X-radiation, said X-radiation passing preferentially through said first type regions thereby preferentially exposing said X-ray sensitive material; and
   (e) developing said X-ray sensitive material thereby forming a replicated image of said pattern in said X-ray sensitive material,
the improvement which comprises providing as said mask a composite body of a thin planar mask substrate and a eutectic in the form of a thin film situate on and contiguous with at least a portion of said substrate.

10. The improved process of claim 9 wherein said eutectic is lamellar.

11. The improved process of claim 10 wherein said eutectic is the eutectic of lead and tin and said first type regions correspond to the tin-rich phase lamellae and said second type regions correspond to the lead-rich phase lamellae.

12. The improved process of claim 10 wherein said eutectic is the eutectic of lead and tin and the minimum feature size is about 0.72 microns.

13. The improved process of claim 10 wherein said eutectic is the eutectic of lead and cadmium and said first type regions correspond to the cadmium-rich phase lamellae and said second type regions correspond to the lead-rich plase lamellae.

14. The improved process of claim 10 wherein said eutectic is the eutectic of lead and cadmium and the minimum feature size is about 0.14 microns.

15. The improved process of claim 10 wherein the lamellae of one phase have been removed by chemical etching creating thereby said first type region.

16. The improved process of claim 9 wherein said mask substrate has a lower X-ray absorption coefficient than said first and second type regions.

17. the improved process of claim 16 wherein the material of said mask substrate is mica.

* * * * *

UNITED STATES PATENT AND TRADEMARK OFFICE
CERTIFICATE OF CORRECTION

PATENT NO. : 4,349,621
DATED : September 14, 1982
INVENTOR(S) : Harvey E. Cline

It is certified that error appears in the above-identified patent and that said Letters Patent is hereby corrected as shown below:

col. 2, line 36 (from the top), after "resolution." begin a new paragraph starting with the word "Pioneering"

col. 2, line 42 (from the top), delete "domonstrated" and insert therefor -- demonstrated -- col. 2, line 59 (from the top), delete "in" and insert therefor -- is -- col. 3, line 39, delete "sechmatic" and insert therefor -- schematic -- col. 4, line 48, delete "where" and insert therefor -- were -- col. 5, lines 10, 19, 20-21, delete "Cu $K_{60}$" and insert therefor -- Cu $K_\alpha$ -- col. 5, line 19, delete "Mo$K_{60}$" and insert therefor -- Mo $K_\alpha$ -- col. 5, line 32, delete "Ag $L_{60}$" and insert therefor -- Ag $L_\alpha$ -- col. 5, line 62, delete "leadrich" and insert therefor -- lead-rich -- col. 6, line 2, delete "degree" and insert therefor -- degrees -- col. 6, line 5, delete "slidification" and insert therefor -- solidification --

UNITED STATES PATENT AND TRADEMARK OFFICE
CERTIFICATE OF CORRECTION

PATENT NO. : 4,349,621
DATED : September 14, 1982
INVENTOR(S) : Harvey E. Cline

It is certified that error appears in the above-identified patent and that said Letters Patent is hereby corrected as shown below:

IN THE CLAIMS:

Claim 9, line 3 of the claim, after "providing" insert -- a --

Signed and Sealed this

Eleventh Day of January 1983

[SEAL]

Attest:

GERALD J. MOSSINGHOFF

Attesting Officer    Commissioner of Patents and Trademarks